(12) United States Patent
Faneuf et al.

(10) Patent No.: US 6,813,149 B2
(45) Date of Patent: Nov. 2, 2004

(54) HIGH CAPACITY AIR-COOLING SYSTEMS FOR ELECTRONIC APPARATUS AND ASSOCIATED METHODS

(75) Inventors: Barrett M. Faneuf, Lakewood, WA (US); William E. Berry, Tacoma, WA (US); Ven R. Holalkere, Dublin, CA (US); David S. De Lorenzo, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 29 days.

(21) Appl. No.: 09/896,869

(22) Filed: Jun. 29, 2001

(65) Prior Publication Data

US 2003/0002254 A1 Jan. 2, 2003

(51) Int. Cl.[7] ................................................. G06F 1/16

(52) U.S. Cl. ...................... 361/687; 361/694; 62/259.2; 415/176

(58) Field of Search ......................... 361/687, 680–686, 361/694–696; 454/184; 62/259.2; 165/80.3, 121–122; 415/176–178; 417/423.2

(56) References Cited

U.S. PATENT DOCUMENTS

| 5,584,233 | A | * | 12/1996 | Glucksman et al. | ........... 99/348 |
| 5,640,046 | A | * | 6/1997 | Suzuki et al. | ................ 257/714 |
| 6,198,628 | B1 | * | 3/2001 | Smith | .......................... 361/695 |
| 6,462,948 | B1 | * | 10/2002 | Leija et al. | .................. 361/697 |
| 6,477,483 | B1 | * | 11/2002 | Scarlat et al. | ............... 702/186 |

\* cited by examiner

Primary Examiner—Hung Van Duong
(74) Attorney, Agent, or Firm—Schwegman, Lundberg, Woessner & Kluth, P.A.

(57) ABSTRACT

An improved air-cooling system for high performance, high density electronic equipment comprises, in one embodiment, a single fan having a radial impeller, a baffle having an inlet portion to efficiently direct air into the fan intake, and a two-tiered outlet plenum to direct one airflow specifically at the highest heat-generating components and another airflow at all components. The air-cooling system is designed to provide maximum cooling for a low-height, high heat-generating electronics module such as a server. By using only a single fan that is matched to the low resistance airflow characteristics of the baffle, the air-cooling system offers significant advantages over multi-fan systems. Also described are a computer server and methods of making heat-dissipation equipment.

28 Claims, 11 Drawing Sheets

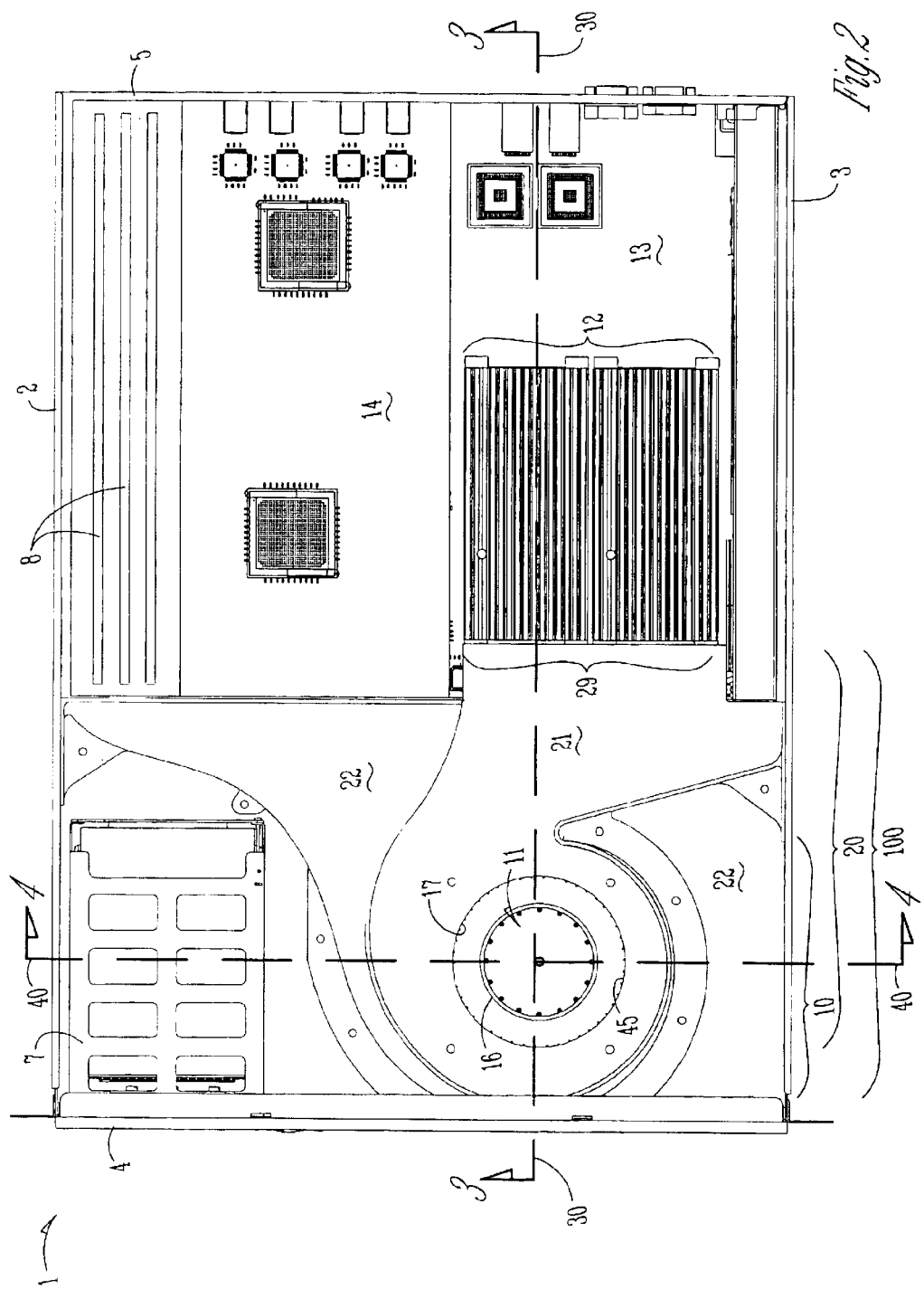

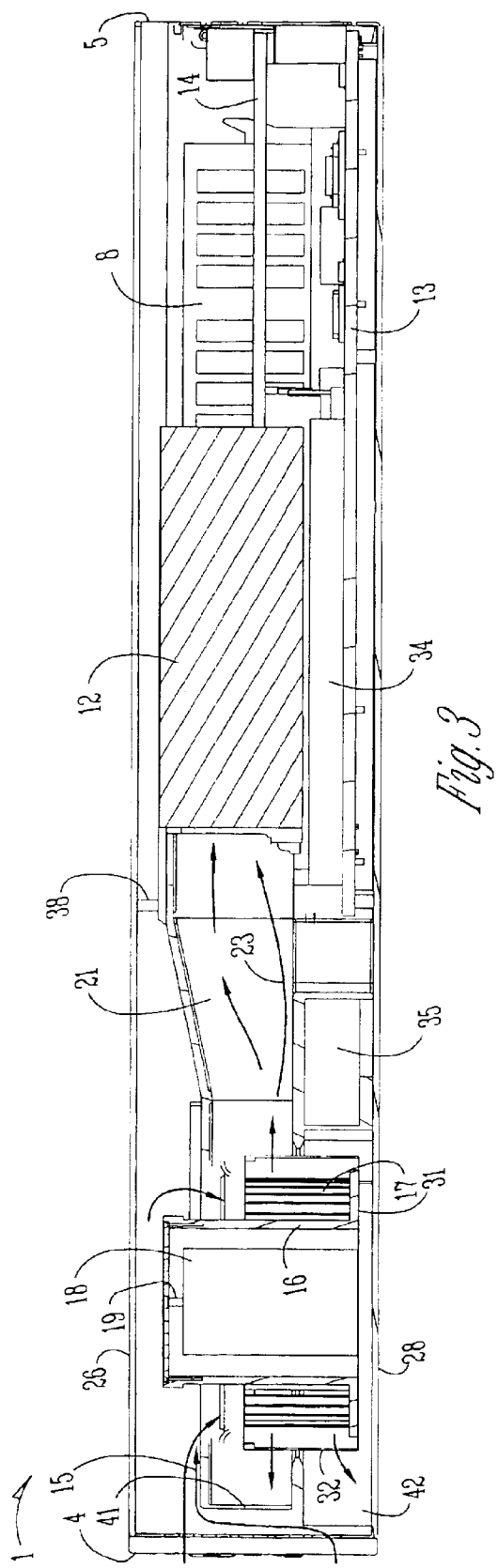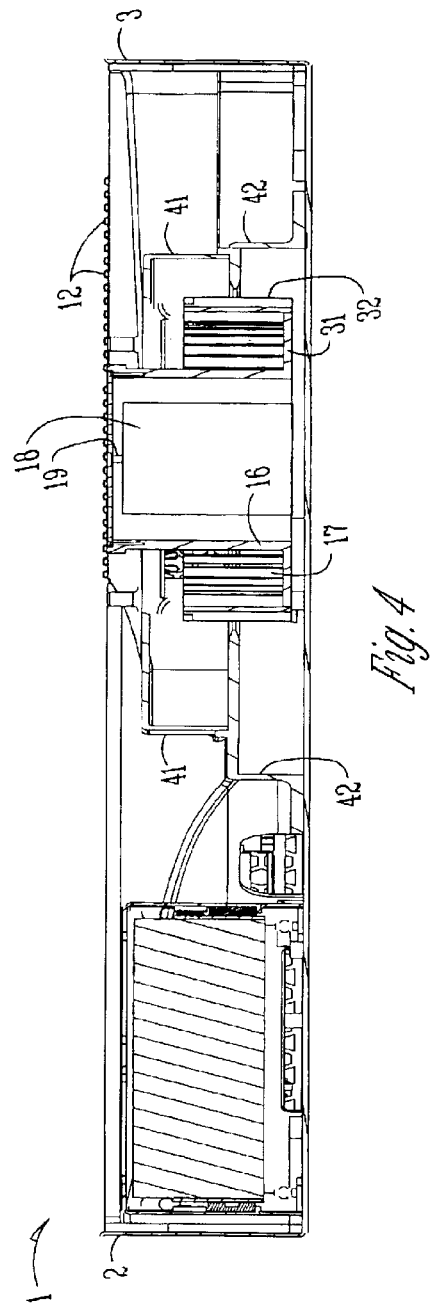

HIGH CAPACITY AIR-COOLING SYSTEMS FOR ELECTRONIC APPARATUS AND ASSOCIATED METHODS

TECHNICAL FIELD OF THE INVENTION

The subject matter relates generally to heat dissipation in electronic apparatus. More particularly, the subject matter relates to an improved air-cooling system for high density electronic equipment.

BACKGROUND INFORMATION

Computer networks, such as the Internet, utilize high performance computer systems called "servers". Servers typically have high performance processors and contain hardware and software capable of handling large amounts of data. Servers provide a large number of computer users with access to large stores of information. For example, servers are used to host web sites that can be accessed by many computers via the Internet.

One or more server components are often housed within a server housing or "server rack". Server racks are typically box-like structures or cabinets that contain a number of removable electronic modules or electronic trays ("e-trays"). Each e-tray can be a different server, or each e-tray can hold one or more components of a server. Server components can include electronic modules, for example, for processors, disk drives (such as floppy disk drives, hard drives, compact disk (CD) drives, and digital video disk (DVD) drives), random access memory (RAM), network interfaces and controllers, SCSI (small computer systems interface) bus controllers, video controllers, parallel and serial ports, power supplies, and so forth.

There is an ever increasing demand by computer users for higher performance levels in computer equipment, such as servers. Because such equipment operates at higher and higher power levels, there is, as a direct consequence, an ever accelerating requirement to dissipate the thermal energy or heat produced by the equipment.

For example, a server having dual high-performance processors, such as processors from the Intel® 64-bit Itanium™ family of processors (available from Intel Corporation, Santa Clara, Calif. U.S.A.), can produce a significant amount of heat, which can be in the order of several hundred watts of heat. To compound the problem, when a server at this performance level is packaged in an industry-standard "1U" height server (i.e. only 1.75 inches (4.445 cm) in height), heat dissipation can become a significant concern. If the heat is not adequately dissipated, the server equipment could be damaged, or the processors could be automatically throttled down to operate at a slower speed than their nominal rating.

Many air-cooled systems have been used to cool electronics equipment, including computer equipment, in the past. In the past, relatively high performance electronic equipment generally required larger, more complex, and more powerful cooling solutions, as well as a corresponding increase in the size of the equipment cabinet or other type of equipment housing.

For example, high performance computer equipment required an increase in the cabinet height to accommodate axial fans having larger propellers, as well as a greater number of axial fans per chassis. It is not unusual to see a half-dozen or more axial-type fans deployed on a single high performance chassis.

These fans, and their associated airflow ducting, can consume an enormous amount of real estate on the chassis. They also contribute substantially to the cost, complexity, size, and height of the computer system, not to mention the additional noise that they produce due to the fact they typically run at high RPM, e.g. exceeding 10,000 RPM.

Floor space for server racks is expensive, and it is desirable to pack as much computer performance into as small a space as possible. However, for the reasons set forth above, this can create significant heat dissipation problems.

For the reasons stated above, and for other reasons stated below which will become apparent to those skilled in the art upon reading and understanding the present specification, there is a significant need in the art for improved air-cooling systems for high performance electronic equipment that do not suffer the disadvantages of the prior art air-cooling systems, and for associated methods of making heat dissipation apparatus for high performance, high density electronic equipment.

BRIEF DESCRIPTION OF THE DRAWINGS

FIG. 2 is a top view of the air-cooled electronics tray illustrated in FIG. 1;

FIG. 3 is a cross-sectional view, taken along dashed line 30 of FIG. 2, of the air-cooled electronics tray illustrated in FIG. 2;

FIG. 4 is a cross-sectional view, taken along dashed line 40 of FIG. 2, of the air-cooled electronics tray illustrated in FIG. 2;

DETAILED DESCRIPTION

In the following detailed description of embodiments of the inventive subject matter, reference is made to the accompanying drawings which form a part hereof, and in which is shown by way of illustration specific preferred embodiments in which the inventive subject matter may be practiced. These embodiments are described in sufficient detail to enable those skilled in the art to practice the inventive subject matter, and it is to be understood that other embodiments may be utilized and that mechanical, compositional, structural, electrical, and procedural changes may be made without departing from the spirit and scope of the inventive subject matter. The following detailed description is, therefore, not to be taken in a limiting sense, and the scope of the inventive subject matter is defined only by the appended claims.

The subject matter provides a solution to the need to efficiently and quietly dissipate heat that is generated by high performance electronic equipment, and to do so in a manner that is relatively simple and inexpensive, and that does not increase chassis height or consume an undue amount of chassis real estate. Various embodiments are illustrated and described herein.

Figure 1:
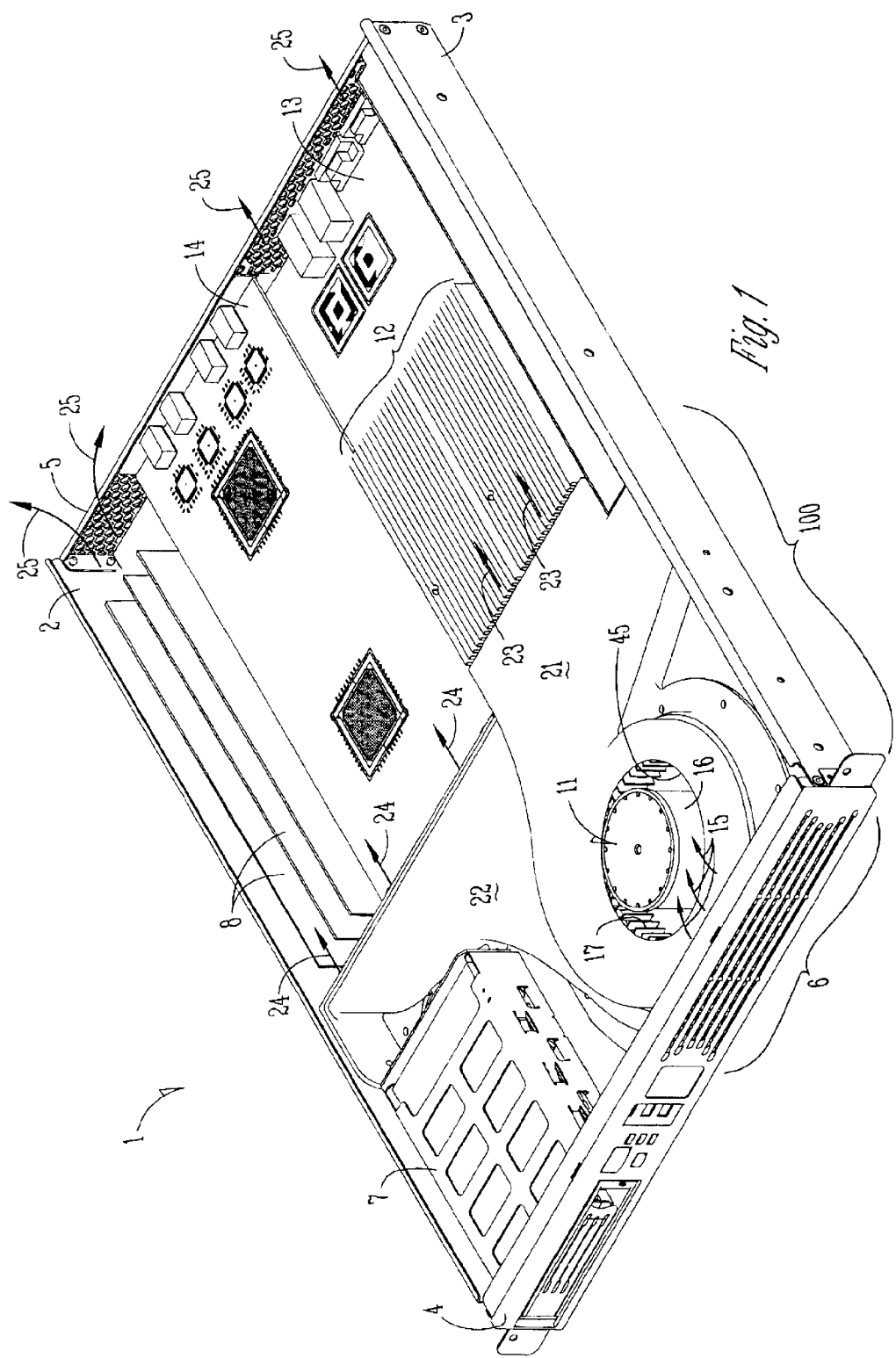
FIG. 1 is a perspective view of an air-cooled electronics tray, in accordance with one embodiment of the subject matter.

FIG. 1 is a perspective view of an air-cooled electronics tray 1, in accordance with one embodiment of the subject matter. Electronics tray ("e-tray") 1 comprises a chassis that includes side panels 2 and 3, front panel 4, rear panel 5, top panel 26 (FIG. 3), and bottom panel 28 (FIG. 3). In one embodiment, e-tray is approximately 1.75" (4.445 cm) high, 17" (43 cm) wide, and 24" (61 cm) deep. A 1U-type chassis is a standard 1.75" (4.445 cm) in height.

E-tray 1 includes electronic apparatus in the form of electronic components, such as hard drive 7, memory boards 8, printed circuit board (PCB) 13, and mezzanine board 14. PCB 13 and mezzanine board 14 can include any number of electronic devices, including integrated circuits (IC's) and discrete devices. The IC's can include memory chips, chipsets, and one or more processor chips.

In one embodiment, e-tray 1 comprises a pair of high performance 64-bit processors from the Intel® Itanium™ family of processors. These processors typically can operate at 1 Gigahertz clock speeds or higher. However, any type of high performance processor(s) could be used on e-tray 1. Further, more than two or fewer than two processors could be used. As used herein, "processor" means any type of computational circuit, such as but not limited to a microprocessor, a microcontroller, a complex instruction set computing (CISC) microprocessor; a reduced instruction set computing (RISC) microprocessor, a very long instruction word (VLIW) microprocessor, a graphics processor, a digital signal processor, a communications processor, an application specific integrated circuit (ASIC), or any other type of processor or processing circuit.

At least one set of heat sink fins 12 or other type of thermal interface arrangement, such as a heat pipe or heat spreader, is provided to conduct heat from devices that produce high levels of heat. Fins 12 conduct heat directly from the heat-generating devices to ambient air surrounding the devices. However, unless the chassis includes a mechanism for ridding itself of this increase in ambient heat, heat will build up to an undesirable level within the chassis, impacting the performance and life of electronic components on the chassis.

Thus e-tray 1 comprises heat-dissipation apparatus. In one embodiment, the heat-dissipation apparatus comprises a fan indicated generally by reference number 11, and an arrangement of baffles. Fan 11 includes a motor housing 18 (FIG. 3) and a radial impeller 17. Radial impeller 17 can be of the "squirrel cage" variety, and its individual vanes or blades can be either forward-curved or reverse-curved relative to the direction of spin. Radial impeller 17 is coupled to an inner wall 16 that, in turn, is coupled to fan motor shaft 19 (FIG. 3).

In one embodiment, fan 11 is a high-output radial impeller fan producing approximately 70 cubic feet (6.5 cubic meters) per minute. Radial fans generally run at much lower RPM (e.g. only 2800 RPM) than axial fans (typically greater than 10,000 RPM). This also significantly increases the lifespan of a radial fan over an axial fan running at much higher RPM. However, the subject matter is not to be construed as limited to the use of a radial impeller fan, and any other type of fan that can generate comparable airflow within the geometrical constraints of the chassis can be used.

Fan 11 draws in outside air through a grill 6 in front panel 4. Grill 6 can serve as an electromagnetic interference (EMI) grid. Alternatively, a separate EMI grid (not shown) can be employed in conjunction with grill 6.

A baffle, indicated generally by reference number 100, directs air into fan 11 and from there out to the electronic components on PCB 13 and on mezzanine 14 that require cooling. As seen better in FIG. 2, baffle 100 comprises an inlet portion, generally indicated by reference number 10, and an outlet portion, generally indicated by reference number 20. Although baffle 100 is described as comprising an inlet portion 10 and an outlet portion, baffle 100 can be implemented in any appropriate number of physical elements, including separate inlet and outlet baffles, a single integrated baffle structure having inlet and outlet portions, and so forth. Baffle 100 can be made of any suitable material, such as molded plastic, fiberglass, or metal.

Referring once again to FIG. 1, fan 11 pumps air into outlet portion 20, indicated generally by reference number 20. Outlet portion 20 comprises two exit plenums 21 and 22. Exit plenums 21 and 22 are formed, in one embodiment, such that their cross-sectional areas increase with increasing distance from fan 11, in a shape that is somewhat analogous to a nautilus shell. This shape minimizes back pressure and turbulence within exit plenums 21 and 22, enabling them to conduct air more efficiently.

In the embodiment shown in FIG. 1, a first portion of the air being pumped by fan 11 goes into exit plenum 21, and a second portion of the air goes into exit plenum 22. This is seen more clearly in FIG. 3 to be discussed below.

Continuing with FIG. 1, the portion of the air going through exit plenum 21 emanates from its air outlet in the direction indicated by arrows 23 and flows through heat sink fins 12 of the processor packages (33–34, FIG. 5), carrying away heated ambient air and exiting the chassis through holes in rear panel 5 in the direction indicated by arrows 25. The air leaving exit plenum 21 is thus directed at chassis components that are generating a relatively large amount of heat.

Similarly, the portion of the air going through exit plenum 22 emanates from its air outlet in the direction indicated by arrows 24 and flows over memory boards 8 and over other heat-generating components on mezzanine 14 and on PCB 13, carrying away heated ambient air and exiting the chassis through holes in rear panel in the direction indicated by arrows 25.

Baffle 100 and fan 11 are individually available from Torrington Research Company, Torrington, Conn., U.S.A., whose URL is WWW.TRC1.com.

FIG. 2 is a top view of the air-cooled electronics tray 1 illustrated in FIG. 1. As mentioned earlier, baffle 100 comprises an inlet portion 10 and an outlet portion 20. If one follows a geometrical line (such as dashed line 30) from grill 6 inward to PCB 13 and mezzanine 14, it is seen that inlet portion 10 and outlet portion 20 overlap to a certain extent, due to the particular geometry of inlet portion 10 and outlet portion 20. However, in other embodiments of a baffle, there may be no overlap, depending upon the particular geometry of the baffle.

The shape of exit plenums 21 and 22 of outlet portion 20 can be seen in FIG. 2. Exit plenum 21 directs air through its end section 29 at heat sink fins 12 of the processors (not shown, but positioned beneath heat sink fins 12). Thus exit plenum 21 directs approximately half of the output of fan 11 at chassis components that are generating a significant amount of heat.

Exit plenum 22 directs air through an end section having a width that is equivalent to the width of the chassis minus the width of the end section 29 of exit plenum 21. Exit plenum 22 directs approximately half of the output of fan 11 at chassis components that are positioned between exit plenum 22 and rear panel 5. This includes, for example, memory boards 8 and mezzanine board 14, as well as to some extent the chassis components that are positioned between exit plenum 21 and rear panel 5, because the air exiting from exit plenums 21 and 22 mixes together before it exits through vent holes in rear panel 5.

FIG. 3 is a cross-sectional view, taken along dashed line 30 of FIG. 2, of the air-cooled electronics tray 1 illustrated in FIG. 2. Dashed line 30 passes through the center of fan motor shaft 19 and the motor housing 18 of fan 11. One end of fan motor shaft 19 is coupled to a motor (not shown for simplicity of illustration) within fan motor housing 18, and the other end of fan motor shaft 19 is coupled to inner wall 16 of radial impeller. Inner wall 16 is, in turn, coupled to a base member 31, to which a plurality of vanes or blades 32 are attached to form radial impeller 17.

Seen in FIG. 3 are steps 41 and 42 of inlet portion 10 of baffle 100. A first portion of the incoming airflow, represented by arrows 15, passes through grill 6 straight into opening 45 (FIG. 1) of fan 1 (FIG. 1), while other portions of the incoming airflow move through grill 6 and then upward over one or both steps 41 and 42 before entering opening 45. A portion 38 of baffle 100 can make contact with top panel 26 to prevent air from recirculating from the exit of baffle 100 back to opening 45.

Also seen in FIG. 3 is exit plenum 21. As explained above, and seen more clearly in FIG. 3, exit plenum 21 receives air from the upper portion of radial impeller 17. Exit plenum 22 is not viewable in FIG. 3; however, a static chamber 35 can be seen (also seen in FIGS. 5, 6, and 8). Static chamber 35 does not conduct air; however, it can be used, for example, to house cables or other chassis components that do not generate significant amounts of heat.

Heat sink fin 12 is affixed to a processor package (34, FIG. 7) situated on PCB 13. Air exiting from both exit plenums 21 and 22 (seen in FIG. 1) blows through the segment of PCB 13 to which the processor packages are mounted.

FIG. 4 is a cross-sectional view, taken along dashed line 40 of FIG. 2, of the air-cooled electronics tray 1 illustrated in FIG. 2. Dashed line 40 passes through the center of fan motor shaft 19 and the motor housing 18 of fan 11.

Also seen in FIG. 4 are steps 41 and 42 of inlet portion MMM of baffle 100. In addition, the upper ends of heat sink fins 12 can be seen.

Figure 5:
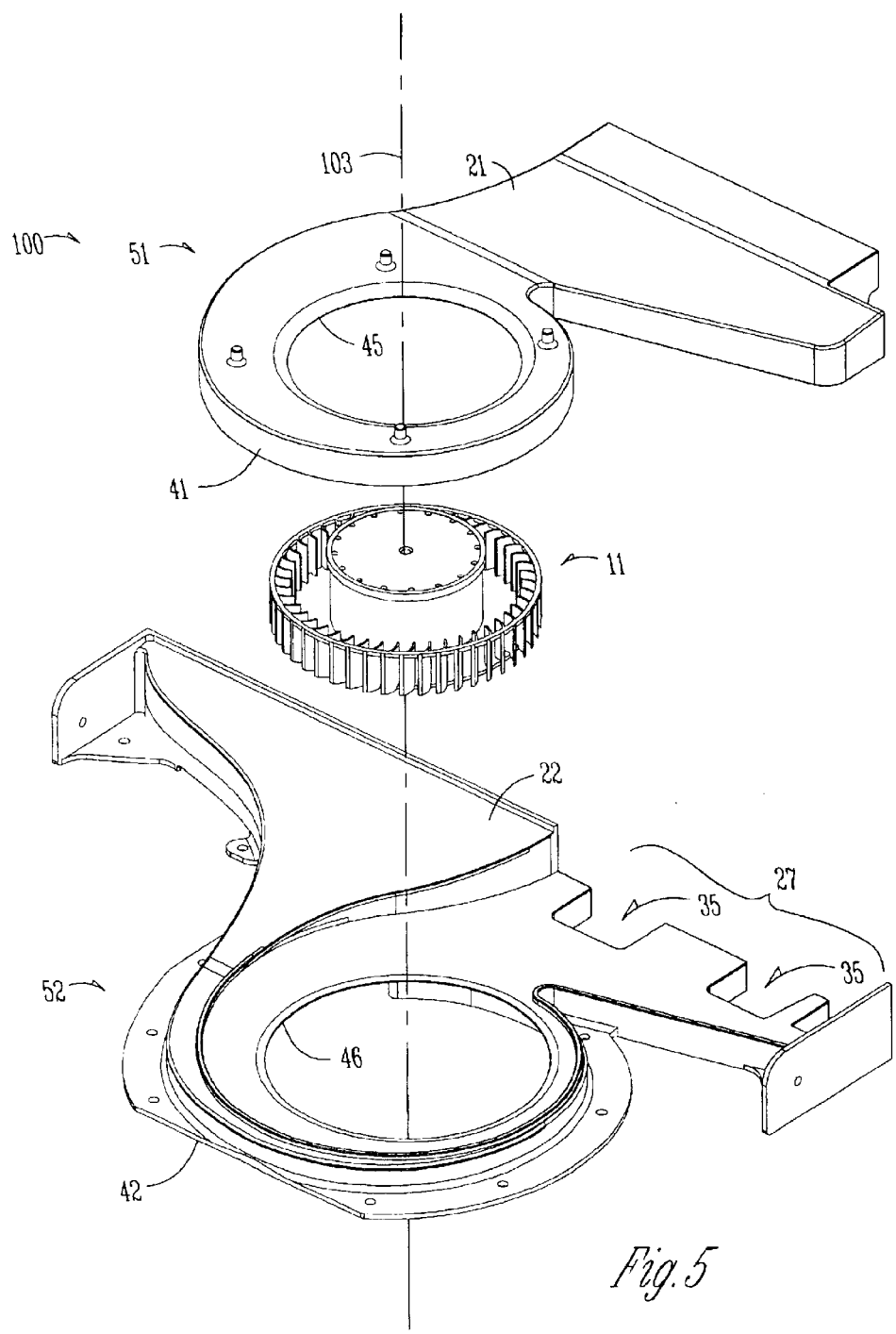
FIG. 5 is an exploded perspective view of the baffle and radial fan illustrated in FIG. 2.

FIG. 5 is an exploded perspective view of the baffle 100 and radial fan 17 illustrated in FIG. 2. Baffle 100 can be formed in a dual-element configuration that includes a first baffle member 51 and a second baffle member 52. Baffle members 51 and 52, when assembled in an orientation along dashed line 103, together form baffle 100, and they surround fan 11.

Baffle member 51 includes inlet step 41, opening 45, and exit plenum 21. Baffle member 52 includes inlet step 42, opening 46, and exit plenum 22. Openings 45 and 46 can have the same diameters. Baffle member 52 also includes a static chamber segment 27 that has several static chambers 35. Static chambers 35 do not conduct airflow. Static chambers 35 prevent recirculation of air back to the inlet of fan 11, and they can be used for storing miscellaneous chassis components.

Figure 6:
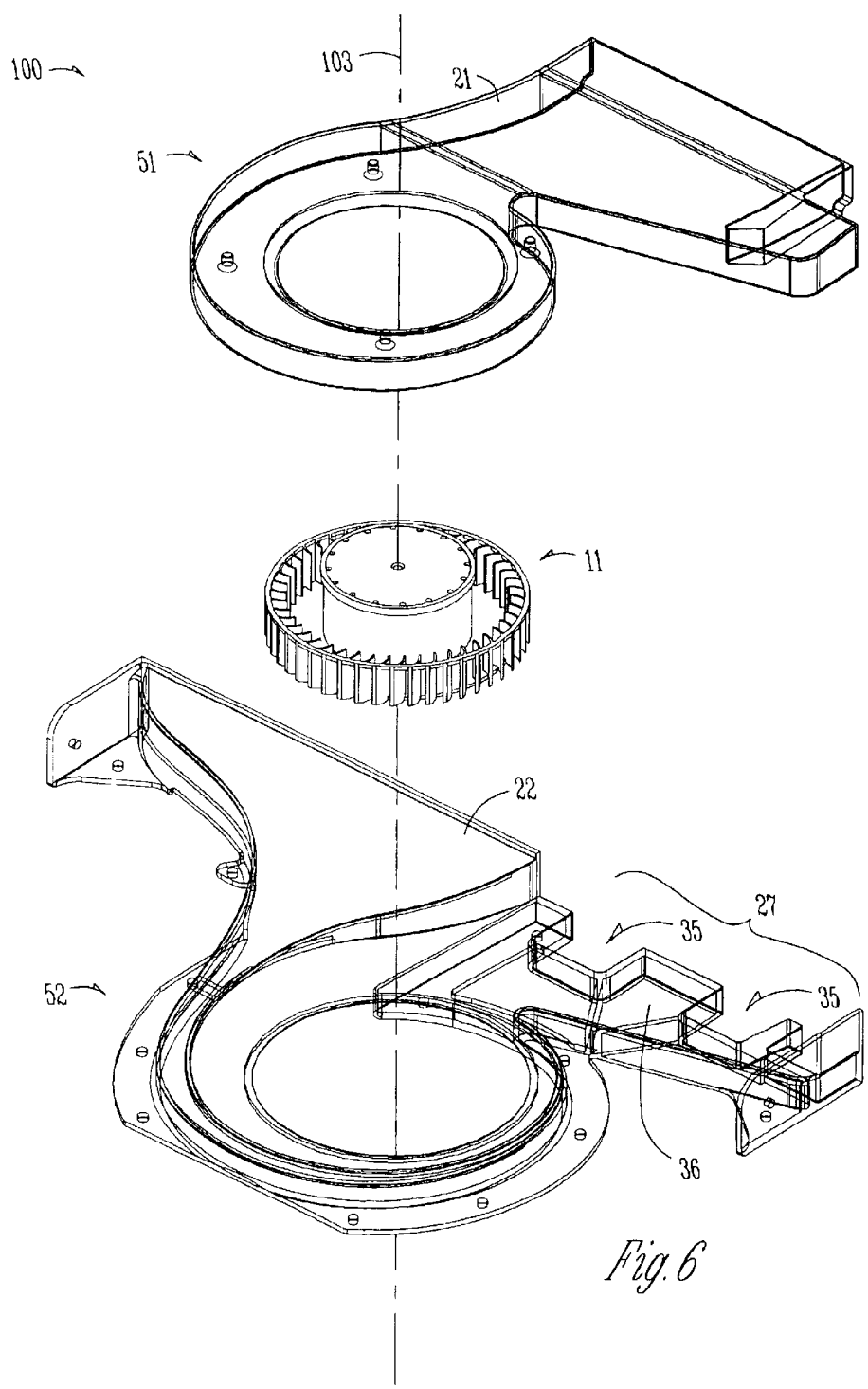
FIG. 6 is a more detailed wireframe perspective view of the baffle members and the radial fan illustrated in FIG. 5.

FIG. 6 is a more detailed wireframe perspective view of the baffle members 51 and 52 and of radial fan 11 illustrated in FIG. 5. The exterior "skins" of exit plenum 21 of baffle member 51 and of static chamber segment 27 of baffle member 52 have been removed to show the interior detail. Chamber 36 within baffle member 52 does not conduct airflow and can be sealed. This area can serve as a support for exit plenum 21 of baffle member 51, when baffle members 51 and 52 are assembled into baffle 100.

Figure 7:
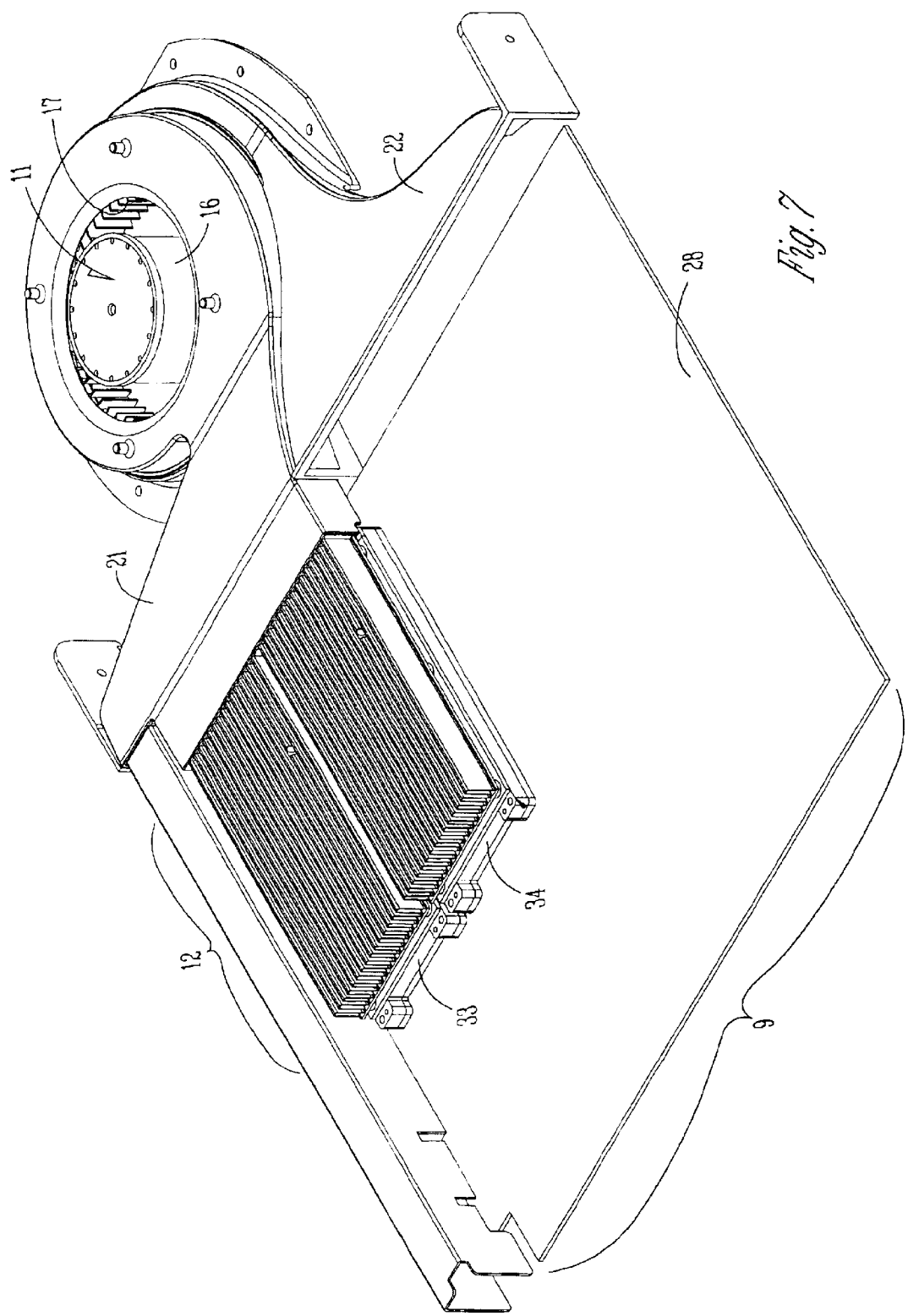
FIG. 7 is a simplified perspective view of the air-cooled electronics tray illustrated in FIG. 1, showing the outlet portion of the baffle as viewed from the exit sides of the exit plenums.

FIG. 7 is a simplified perspective view of the air-cooled electronics tray 1 illustrated in FIG. 1, showing the outlet portion of baffle 100 as viewed from the exit sides of exit plenums 21 and 22.

As described earlier, exit plenum 21 directs air through its end section at heat sink fins 12 of processor packages 33 and 34. Exit plenum 22 directs air through an end section having a width that is equivalent to the width of the chassis minus the width of the end section of exit plenum 21. Exit plenum 22 directs approximately half of the output of fan 11 at chassis components that are positioned anywhere between exit plenum 22 and the rear edge 9 of the chassis, because the air exiting from exit plenums 21 and 22 mixes together before it exits through vent holes in rear panel 5 (FIG. 1).

Figure 8:
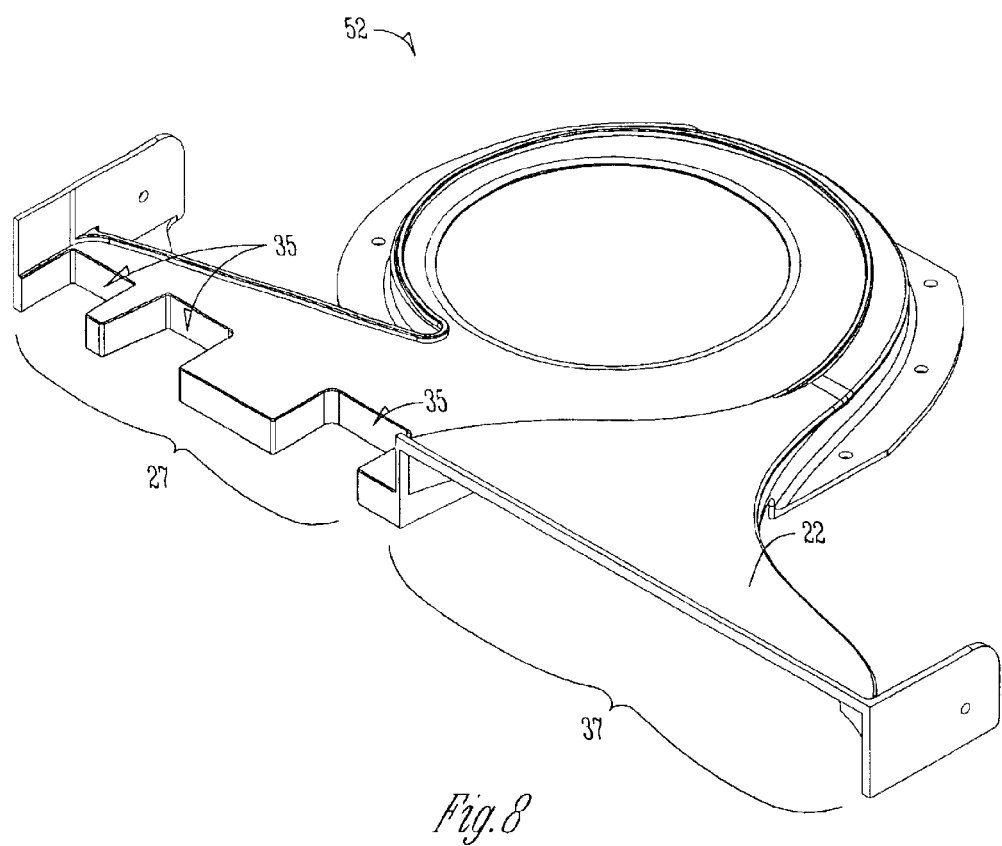
FIG. 8 is a rear perspective view of a baffle member shown in FIG. 5.

FIG. 8 is a rear perspective view of baffle member 52 shown in FIG. 5. This view is from essentially the same perspective as the exit plenum 22 is depicted in FIG. 7. Baffle member 52 includes an opening 37 in exit plenum 22. Also seen in FIG. 8 are several static chambers 35 of static chamber segment 27.

Figure 9:
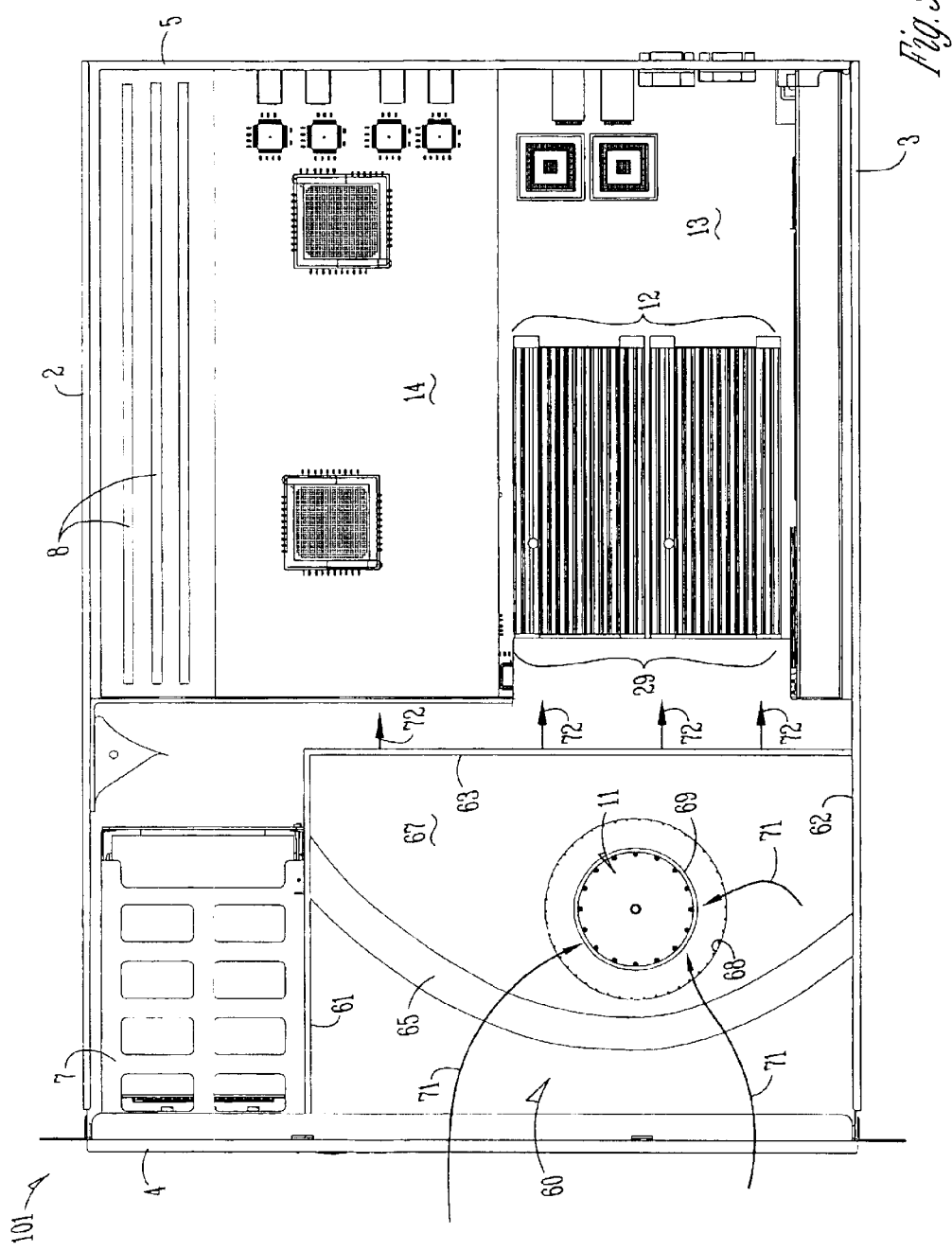
FIG. 9 is a top view of an air-cooled electronics tray having a different baffle, in accordance with another embodiment of the subject matter.

FIG. 9 is a top view of an air-cooled electronics tray 101 having a different baffle 60, in accordance with another embodiment of the subject matter. In the embodiment shown in FIG. 9, all elements of the electronics tray 101 can be substantially similar to those depicted in FIGS. 1 and 2 except for baffle 60.

Baffle 60 directs air, represented by arrows 71, into opening 68, through fan 11, and out an exit plenum in the direction indicated by arrows 72 towards chassis components requiring cooling. Baffle 60 will now be described in greater detail regarding FIG. 10 immediately below.

Figure 10:
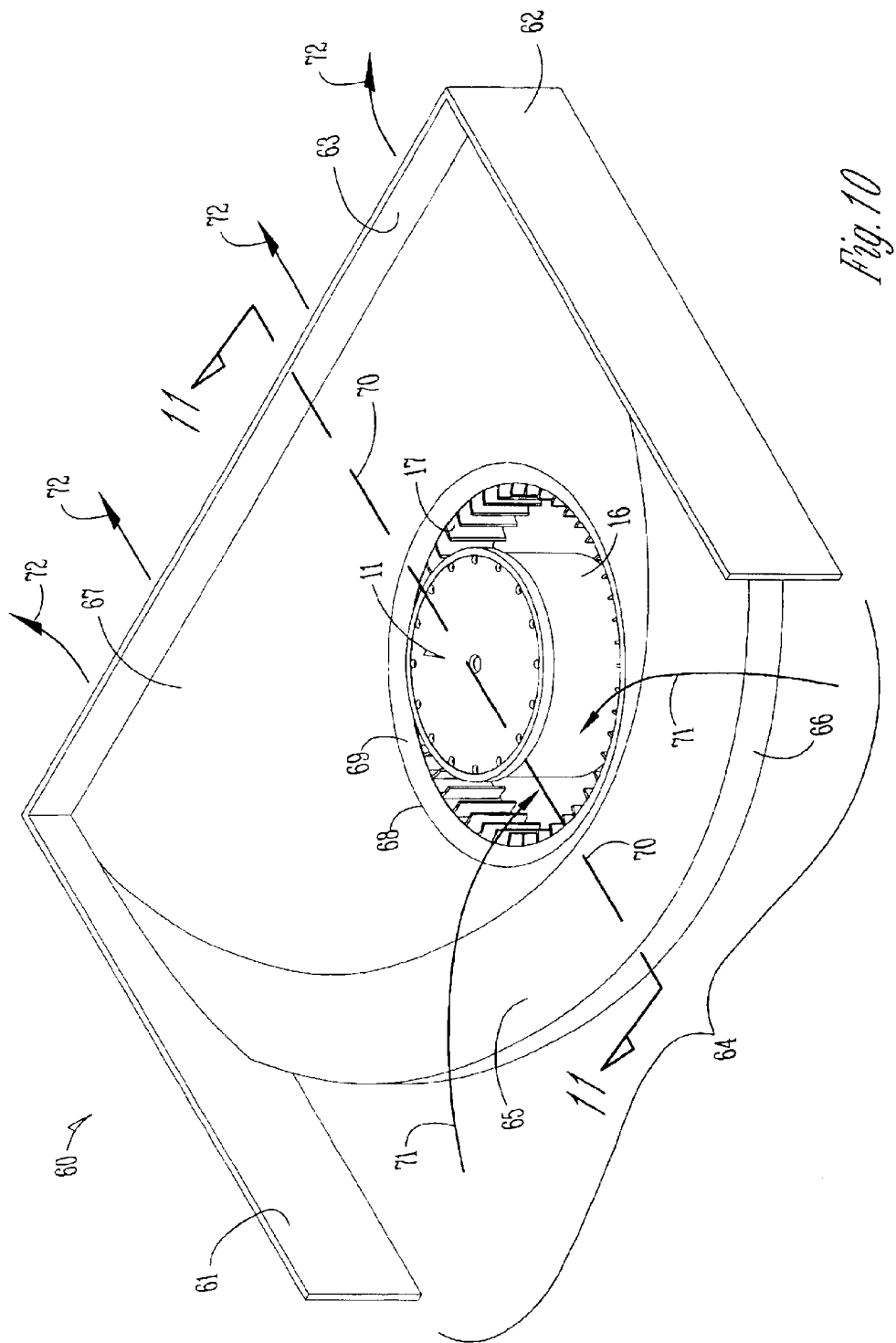
FIG. 10 is a perspective view of the inlet portion of the baffle of the air-cooled electronics tray illustrated in FIG. 9.

FIG. 10 is a perspective view of the inlet portion of baffle 60 of the air-cooled electronics tray 101 illustrated in FIG. 9. Baffle 60 comprises a pair of substantially vertical sides 61 and 62, and it further comprises a bottom in the form of a raised platform 67. A back wall 63 extends along the back of platform 67. Side 61, side 62, back wall 63, platform 67, and the top panel 26 (FIG. 3) form a box-like intake plenum that bounds the air that is drawn in by fan 11. Sides 61 and 62, back wall 63, and top panel 26 may be planar. Airflow 72 is prevented from being recirculated back to fan 11 by this structure.

Platform 67 comprises a large opening 68 juxtaposed to the intake of fan 11. Opening 68 has a rounded lip 69 in one embodiment.

The approach area 64 to baffle 60 comprises an angled ramp 65. Ramp 65 can have a step 66 around its outer periphery. Ramp 65 is formed in an arc about one side of opening 68. Ramp 65 decreases the cross-sectional area of the intake plenum in relation to the distance from the opening 68.

In operation, air is drawn into the approach area 64 of baffle 60, and it flows in the direction of arrows 71 over step 66, up ramp 66 onto platform 67, through opening 68, and into the intake of fan 11.

As seen in FIG. 1, the periphery of grill 6 in front panel 4 (FIG. 1) bounds a relatively small cross-sectional area through which all of the intake air must pass. To minimize the amount of work that fan 11 must perform, it is desirable to minimize the length of the region of narrowing cross-section that runs from grill 6 to platform 67. By providing an angled ramp 65, the region of narrowing cross-section is kept to a minimum, and intake air is efficiently funneled into the intake of fan 11. Employing a relatively short region of small cross-section improves air intake performance over a non-ramped inlet to the baffle, in part because it offers less overall resistance to incoming airflow, and in part because back-pressure, vortices, eddys, and other undesirable airflow disturbances are minimized through the use of a short angled ramp 65, as opposed to a long, non-angled intake region or a rectangular intake region.

In addition, an angled ramp 65 also enables EMI containment in the form of a grill or mesh to be positioned in the area of greatest cross-sectional area, not in a region of small cross-sectional area. Sufficient EMI containment can thus be provided while concurrently minimizing its effect on air flowing into the intake of fan 11.

Baffle 60 can be made of any suitable material, such as molded plastic, fiberglass, or metal.

Figure 11:
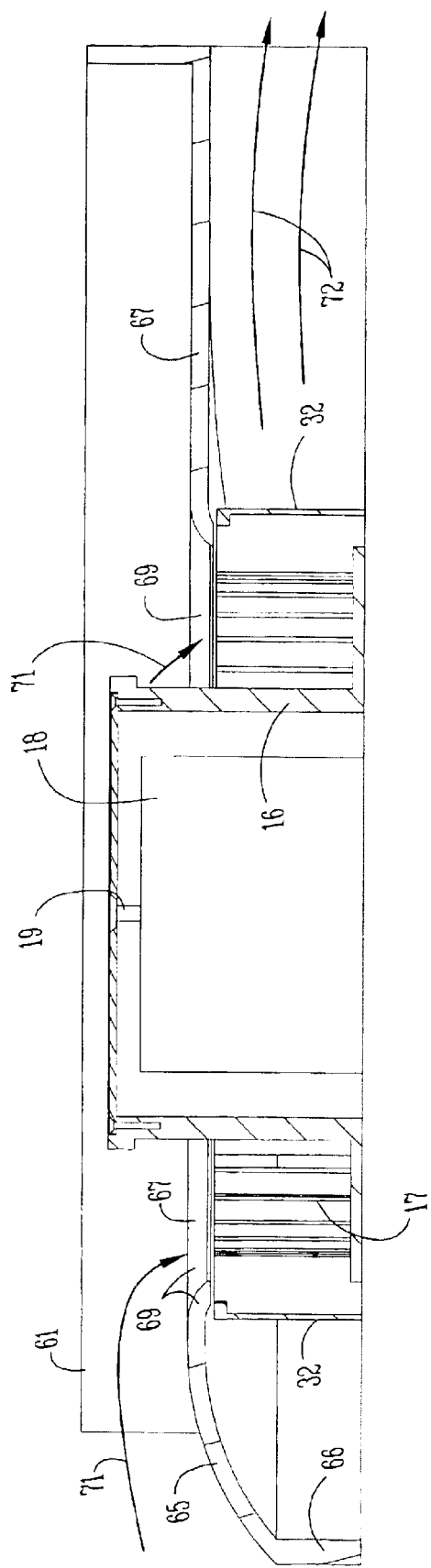
FIG. 11 is a cross-sectional view, taken along dashed line 70 of FIG. 10, of the baffle illustrated in FIG. 10.

FIG. 11 is a cross-sectional view, taken along dashed line 70 of FIG. 10, of the baffle 60 illustrated in FIG. 10. The profile of angled ramp 65 can clearly be seen in FIG. 11, as can the lip 69 around opening 68 (FIG. 10) of platform 67 of baffle 60. Radial impeller 17 comprises a plurality of blades or vanes 32 that are coupled to base member 31 of radial impeller 17.

Figure 12:
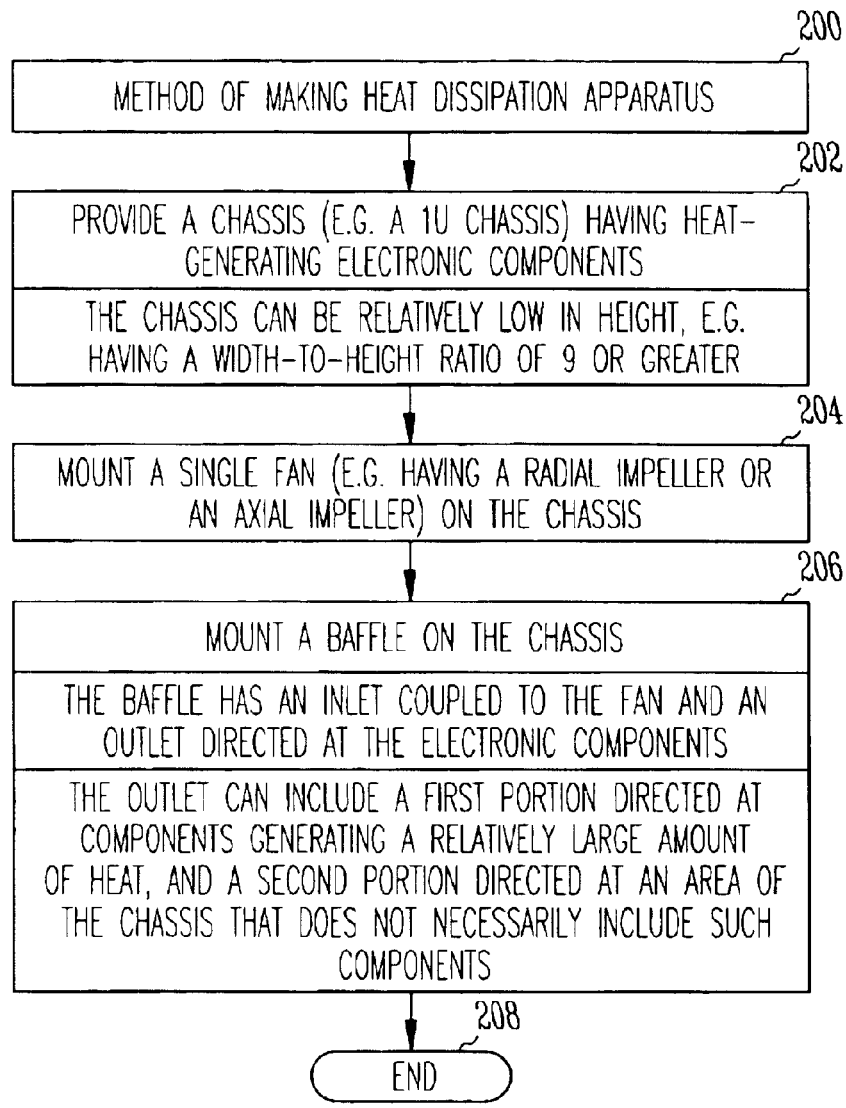
FIG. 12 is a flow diagram illustrating a method of making heat dissipation apparatus for cooling an electronic assembly or other type of electronic chassis, in accordance with one embodiment of the subject matter.

FIG. 12 is a flow diagram illustrating a method of making heat dissipation apparatus for cooling an electronic assembly or other type of electronic chassis, in accordance with one embodiment of the subject matter. The method begins at 200.

In 202, a chassis having a plurality of heat-generating components (e.g. IC's and/or discrete devices such as resistors, capacitors, and inductors) is provided. In one embodiment, a computer server is provided. In another embodiment, a 1U e-tray is provided that can be any type of electronic equipment, including a computer component. The chassis can be relatively low in height; e.g. in one embodiment the width-to-height ratio of the chassis is approximately 9 or greater. However, embodiments of the subject matter also perform well for width-to-height ratios that are less than 9, i.e. for chassis that are relatively high such as, without limitation, 4U or 7U chassis. The geometry of the fan and of the inlet and outlet portions of the baffle can be appropriately adjusted.

While the embodiment shown in the figures is a server that is positioned in a horizontal rack, the subject matter can also be used in vertical-type racks. For example, the exit plenums of the outlet portion of the baffle could be arranged side-by-side vertically rather than double-tiered horizontally.

In 204, a fan is mounted on the chassis. The fan can be of any type, such as a radial impeller fan, an axial impeller fan, or any other suitable type. In one embodiment, a single radial impeller fan is used to quietly, efficiently, cost-effectively, and reliably cool an entire server chassis or e-tray of the 1U form factor. However, in other embodiments, more than one fan can be used.

In 206, a baffle is mounted on the chassis. In one embodiment, the baffle is constructed as one unit encompassing both an inlet baffle and an outlet baffle. In such an embodiment, the baffle has an inlet coupled to the fan and an outlet that is directed at the electronic components of the chassis. In another embodiment, as discussed earlier, separate inlet and outlet baffles can be utilized, and in such an embodiment the inlet baffle is coupled to the fan and directs air into the fan intake, and the outlet baffle directs air at the electronic components of the chassis.

Still referring to 206, the outlet can include a first portion that is directed to electronic components that are generating a relatively large amount of heat, and a second portion that is directed at an area of the chassis that does not necessarily include such high heat generating components. Various alternatives are possible. For example, in one embodiment, the second portion can direct air towards electronic components over the entire chassis, or it could direct air only towards all electronic components except for those covered by the first portion, or it could direct air at a subset of the remaining electronic components, leaving a portion of the electronic components (e.g. low heat generating components) that are not covered by either the first or second portions. In 208, the method ends.

The operations described above with respect to the method illustrated in FIG. 12 can be performed in a different order from that described herein. Also, it should be understood that although an "End" block is shown for the method, it may be continuously performed.

The subject matter provides for heat-dissipation apparatus for high density electronic equipment, which in one embodiment comprises a relatively low-height server, such as a 1U server. In one embodiment, the ratio of width to height of the server is approximately 9 or greater; however, other width-to-height ratios are possible.

In one embodiment, a single fan, such as a radial impeller fan, is coupled to an inlet baffle, or to an inlet portion of a baffle, that provides efficient air flow into the fan, and to an outlet baffle, or to an outlet portion of a baffle, that directs a relatively high volume of air over heat-generating components on a chassis of the electronic equipment. This air-cooling arrangement is highly efficient and is capable of cooling a 1U server housing a pair of high-performance 64-bit processors, such as processors from Intel's Itanium™ family of processors.

Other embodiments described herein include an electronic apparatus that includes a heat-dissipation apparatus essentially as described above; an inlet baffle having a cross-sectional area that increases with the distance from a fan inlet to which it is coupled and further having a ramp to the fan inlet; and methods of making an air-cooled chassis.

Various embodiments of the subject matter enable high density electronic apparatus to operate reliably and quietly within its thermal performance specifications.

As shown herein, the subject matter can be implemented in a number of different embodiments. Other embodiments will be readily apparent to those of ordinary skill in the art. The elements, materials, geometries, dimensions, and sequence of operations can all be varied to suit the particular requirements of the electronic apparatus with which various implementations of the subject matter may be used.

The subject matter should not be construed as restricted to servers or 1U servers, and it may find application in any type of electronic assembly. For example, it can be used for telecommunications equipment, power industry equipment, industrial equipment, radio and television broadcasting equipment, aerospace and military equipment, maritime equipment, automotive equipment, and personal entertainment equipment (e.g., televisions, radios, stereos, tape and compact disc players, videocassette recorders, MP3 (Motion Picture Experts Group, Audio Layer 3) players, etc.), and the like. Thus, as used herein, the terms "server" or "electronic assembly" are intended to mean any type of electronic assembly structure.

The terms "top", "bottom", "front", and "back" are to be understood as relative terms, and it should be understood that the scope of the subject matter includes corresponding elements in structures that may be inverted, turned end-for-end, mirrored, or rotated through 90 degrees or through any other angle, relative to those shown in the figures and described herein.

The above-described choice of materials, geometry, structure, and assembly operations can all be varied by one of ordinary skill in the art to optimize heat dissipation in electronic assemblies. The particular implementation of the subject matter is very flexible in terms of the orientation, size, number, and composition of its constituent elements. Various embodiments of the subject matter can be implemented using any one or more of various geometrical and functional arrangements of radial or axial fans, inlet and/or outlet baffles or ducts, and combinations thereof, to achieve the advantages of the subject matter.

The figures are merely representational and are not drawn to scale. Certain proportions thereof may be exaggerated, while others may be minimized. FIGS. 1–8 are intended to illustrate various implementations of the subject matter that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

What is claimed is:

1. Heat-dissipation apparatus for high density electronic equipment comprising:
   a radial impeller fan having a fan intake; and
   a baffle comprising a box-like inlet plenum having a pair of planar sides, a planar back wall, a planar top, and a bottom that includes a ramp angled towards and forming an arc about one side of the fan intake, wherein the inlet plenum has a cross-sectional area that increases with distance from the fan, and wherein the inlet plenum and the ramp are to direct air into the fan intake.

2. The heat-dissipation apparatus recited in claim 1, wherein the electronic equipment comprises a dual-processor server.

3. The heat-dissipation apparatus recited in claim 1, wherein the electronic equipment comprises a relatively low-height server.

4. The heat-dissipation apparatus recited in claim 1, wherein the baffle further comprises an exit plenum having a cross-sectional area that increases with distance from the fan.

5. The heat-dissipation apparatus recited in claim 3, wherein the ratio of width to height of the server is 9 or greater.

6. The heat-dissipation apparatus recited in claim 3, wherein the server is a 1U server.

7. The heat-dissipation apparatus recited in claim 4, wherein the baffle comprises an additional exit plenum having a cross-sectional area that increases with distance from the fan, and wherein the exit plenum and the additional exit plenum each comprise an air outlet, one of which is directed at components generating a relatively large amount of heat, and one of which is directed at an area of the electronic equipment that does not necessarily include such components.

8. Electronic apparatus comprising:
   a chassis comprising heat-generating electronic components; and
   heat-dissipation apparatus comprising:
       a radial impeller fan having a fan intake; and
       a baffle comprising an inlet plenum having a cross-sectional area that increases with distance from the fan, and the baffle further comprising a ramp coupled to the fan intake, wherein the inlet plenum and the ramp am to direct air into the fan intake;
   wherein the baffle further comprises an exit plenum having a cross-sectional area that increases with distance from fan;
   wherein the baffle comprises an additional exit plenum having a cross-sectional area that increases with distance from the fan; and
   wherein the exit plenum and the additional exit plenum each comprise an air outlet, one of which is directed at components generating a relatively large amount of heat, and one of which is directed at an area of the chassis that does not necessarily include such components.

9. The electronic apparatus recited in claim 8, wherein the electronic components include at least two processors.

10. The electronic apparatus recited in claim 8, wherein the chassis comprises a relatively low-height server.

11. The electronic apparatus recited in claim 10, wherein the ratio of width to height of the server is 9 or greater.

12. The electronic apparats recited in claim 10, wherein the server is a 1U server.

13. A server comprising:
   a chassis comprising heat-generating electronic components; and
   heat-dissipation apparatus comprising:
       a radial impeller fan having a fan intake; and
       a baffle comprising a box-like inlet plenum having a pair of planar sides, a planar back wall, a planar top, and a bottom that includes a ramp angled towards and forming an arc about one side of the fan intake, wherein the inlet plenum has a cross-sectional area that increases with distance from the fan, and wherein the inlet plenum and the ramp are to direct air into the fan intake.

14. The server recited in claim 13, wherein the electronic components include a plurality of processors.

15. The server recited in claim 13, wherein the processors are 64-bit processors and operate at 1 Gigahertz clock speed or higher.

16. The server recited in claim 13, wherein the chassis comprises a relatively low-height server.

17. The server recited in claim 16, wherein the ratio of width to height of the server is 9 or greater.

18. The server recited in claim 16, wherein the server is a 1U server.

19. A 1U electronics assembly comprising:
   a chassis comprising heat-generating electronic components; and heat-dissipation apparatus comprising:
  a single fin having a fan intake; and
  a baffle comprising an inlet plenum coupled to the fan intake and an outlet plenum directed at the electronic components, wherein the inlet plenum is to direct air into the fan intake;
wherein the outlet plenum has a cross-sectional area that increases with distance from the fan;
wherein the baffle comprises an additional outlet plenum having a cross-sectional area that increases with distance from the fan; and
wherein the outlet plenum and the additional outlet plenum each comprise an air outlet, one of which is directed at components generating a relatively large amount of heat, and one of which is directed at an area of the chassis that does not necessarily include such components.

20. The electronics assembly recited in claim 19, wherein the fan comprises a radial impeller fan.

21. The electronics assembly recited in claim 19, wherein the electronic components include a plurality of processors.

22. The electronics assembly recited in claim 21, wherein the processors are 64-bit processors and operate at 1 Gigahertz clock speed or higher.

23. A method comprising:
  providing a chassis comprising heat-generating electronic components, the chassis having a width-to-height ratio of 9 or greater;
  mounting a single fan on the chassis; and
  mounting a baffle on the chassis, the baffle comprising an inlet coupled to the fan to direct air into the fan, the baffle further comprising a first portion having a cross-sectional area that increases with distance from the fan, the baffle further comprising a second portion having a cross-sectional area that increases with distance from the fan,
  wherein the first portion is directed at components generating a relatively large amount of heat, and
  wherein the second portion is directed at an area of the chassis that does not necessarily include such components.

24. The method recited in claim 23, wherein the fan comprises a radial impeller.

25. The method recited in claim 23, wherein the fan comprises an axial impeller.

26. A method comprising:
  providing a 1U chassis comprising heat-generating electronic components;
  mounting a single fan on the chassis; and
  mounting a baffle on to chassis, the baffle comprising an inlet coupled to the fan to direct air into the fan, the baffle further comprising a first portion having a cross-sectional area that increases with distance from the fan, the baffle further comprising a second portion having a cross-sectional area that increases with distance from the fan,
  wherein the first portion is directed at components generating a relatively large amount of heat, and
  wherein the second portion is directed at an area of the chassis that does not necessarily include such components.

27. The method recited in claim 26, wherein the fan comprises a radial impeller.

28. The method recited in claim 26, wherein the fan comprises an axial impeller.

* * * * *

UNITED STATES PATENT AND TRADEMARK OFFICE
CERTIFICATE OF CORRECTION

PATENT NO. : 6,813,149 B2
DATED : November 2, 2004
INVENTOR(S) : Faneuf et al.

It is certified that error appears in the above-identified patent and that said Letters Patent is hereby corrected as shown below:

<u>Column 10,</u>
Line 20, delete "am" and insert -- are --.
Line 23, after "from" insert -- the --.
Line 39, delete "apparats" and insert -- apparatus --.

<u>Column 11,</u>
Line 2, delete "fin" and insert fan --.

<u>Column 12,</u>
Line 17, delete "to" and insert -- the --.

Signed and Sealed this

Twenty-fifth Day of April, 2006

JON W. DUDAS
*Director of the United States Patent and Trademark Office*